(12) United States Patent
Kim et al.

(10) Patent No.: US 7,692,405 B2
(45) Date of Patent: Apr. 6, 2010

(54) SINGLE UNIT PROTECTION CIRCUIT MODULE AND BATTERY PACK USING THE SAME

(75) Inventors: Youngu Kim, Yongin-si (KR); Bong Young Kim, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 372 days.

(21) Appl. No.: 11/691,547

(22) Filed: Mar. 27, 2007

(65) Prior Publication Data
US 2007/0222417 A1    Sep. 27, 2007

(30) Foreign Application Priority Data
Mar. 27, 2006    (KR)    ........................ 10-2006-0027525

(51) Int. Cl.
*H01M 10/46* (2006.01)
(52) U.S. Cl. ........................... 320/134; 320/136
(58) Field of Classification Search ................ 320/107, 320/112, 114, 134, 136
See application file for complete search history.

(56) References Cited

U.S. PATENT DOCUMENTS

| 5,896,025 | A  | * | 4/1999  | Yamaguchi et al. | ......... | 320/134 |
| 6,172,485 | B1 | * | 1/2001  | Fujita et al.    | ......... | 320/136 |
| 7,456,614 | B2 | * | 11/2008 | Sato et al.      | ......... | 320/134 |
| 2005/0156574 | A1 | * | 7/2005 | Sato et al.      | ......... | 320/134 |
| 2006/0076930 | A1 | * | 4/2006 | Ooshita et al.   | ......... | 320/134 |
| 2006/0208850 | A1 | * | 9/2006 | Ikeuchi et al.   | ......... | 320/136 |

* cited by examiner

*Primary Examiner*—Edward Tso
(74) *Attorney, Agent, or Firm*—Stein McEwen, LLP

(57) ABSTRACT

A protection circuit module includes a printed circuit board in which at least one wiring pattern is formed, a conductive pad that is coupled to a wiring pattern of the printed circuit board, and is electrically coupled to a rechargeable battery, and a semiconductor package that is soldered on the wiring pattern of the printed circuit board, so that if the voltage of the rechargeable battery is in the overcharged or over-discharged state, the semiconductor package selectively blocks a charging path or a discharging path of the rechargeable battery.

27 Claims, 5 Drawing Sheets

SINGLE UNIT PROTECTION CIRCUIT MODULE AND BATTERY PACK USING THE SAME

CROSS-REFERENCE TO RELATED APPLICATION

This application claims priority to Korean Patent Application No. 2006-27525, filed on Mar. 27, 2006 in the Korean Intellectual Property Office, the disclosure of which is incorporated herein by reference.

BACKGROUND OF THE INVENTION

1. Field of the Invention

Aspects of the present invention relate to a protection circuit module and a battery pack using the same, and more particularly, to a protection circuit module and a battery pack using the same having a small printed circuit board area, being resistant to electromagnetic waves or static electricity, and having reduced cost achieved by integrating an integrated circuit (IC), a charging switch, and a discharging switch in one semiconductor package.

2. Description of the Related Art

In general, lithium-type secondary batteries are high in energy density when compared with those of conventional nickel-cadmium and nickel-hydride batteries. Examples of lithium-type secondary batteries include lithium ion batteries and lithium ion polymer batteries. Lithium-type secondary batteries are mainly used as a power source of portable electronic devices such as a notebook computer, a mobile phone, and a personal digital assistant (PDA).

However, if lithium-type secondary batteries are used in an inappropriate manner, there is a high probability that they explode or spontaneously combust because of their unstable chemical components. Accordingly, what is referred to as a "Protection Circuit Module" is mounted on the lithium-type secondary batteries in order to protect the batteries from being overcharged and over-discharged, and in order to prevent a drop in the performance thereof.

FIGS. 1A and 1B illustrate an outline of a related art protection circuit module. As illustrated, the related art protection circuit module 100' includes a plate-type printed circuit board 110', an integrated circuit 120', a charging switch 130', a discharging switch 140', a plurality of passive elements 151' and 152', and conductive pads 161' and 162'. As illustrated, the integrated circuit 120' is of a one semiconductor-package type, and senses the voltage and the current of a secondary battery (not shown), and thereby turns on or off the charging switch 130' and the discharging switch 140'. Further, the charging switch 130' and the discharging switch 140' are of a one semiconductor-package type, respectively. The integrated circuit 120' and the charging switch 130', and the integrated circuit 120' and the discharging switch 140', are coupled to each other through a wiring pattern formed on the printed circuit board 110'. Further, the charging switch 130' and the discharging switch 140' can be a Power MOSFET.

Referring to FIG. 2, illustrated is a circuit diagram of the related art battery pack that includes the related art protection circuit module. As illustrated, the related art battery pack 200' includes a secondary battery 210', pack terminals 171' and 172', a resistor 151', a capacitor 152', an integrated circuit 120', a charging switch 130', and a discharging switch 140'. The charging switch 130' and the discharging switch 140' are electrically coupled to the integrated circuit 120' by the wiring pattern 111'. Accordingly, the charging switch 130' and the discharging switch 140' can be turned on or off by a control signal of the integrated circuit 120'. Further, a charger or an outside system is electrically coupled to the pack terminals 171' and 172'.

In the related art battery pack 200', the integrated circuit 120' senses the charging voltage or the discharging voltage of the secondary battery 210'. For example, if the secondary battery 210' is overcharged, the integrated circuit 120' outputs a predetermined control signal to the charging switch 130'. Accordingly, the charging switch 130' is turned off, to thereby prevent additional charging. Further, if the secondary battery 210' is over-discharged, the integrated circuit 120' outputs a predetermined control signal to the discharging switch 140'. Accordingly, the discharging switch 140' is turned off to thereby prevent additional discharging.

A parasitic diode is formed in the charging switch 130' and the discharging switch 140', respectively. Hence, if the charging switch 130' is turned off by the overcharging of the secondary battery 210', the secondary battery 210' goes to a dischargeable state. Further, if the discharging switch 140' is turned off by the over-discharging of the secondary battery 210', the secondary battery 210' goes to a chargeable state.

SUMMARY OF THE INVENTION

However, the related art protection circuit module and a battery pack thereof are mounted on the printed circuit board such that the integrated circuit and two switches are each formed as a semiconductor-package type device. Thus, the length and the width of the printed circuit board increases due to the individual semiconductor packages, which is disadvantageous. Accordingly, the total volume of the battery pack needs to be increased based on the increased size of the printed circuit board. If there is a limit in the maximum volume of the battery pack, the relative volume occupied by the secondary battery in the battery pack will decrease. Accordingly, such limits the capacity of the secondary battery.

Further, in the related art protection circuit module and the battery pack, the number of main parts to be soldered to the printed circuit board is 3, and requires at least 3 operations of soldering to be performed. Accordingly, the number of operations to make the related art printed circuit board and the probability of soldering defects increases.

Further, in the related art protection circuit module and the battery pack, a separate wiring pattern needs to be formed on the printed circuit board in order to couple the integrated circuit with the two switches. Hence, an additional wiring-pattern-forming process on the printed circuit board is necessary. The wiring-patterns increase the probability that an external static electricity or an electromagnetic wave will flow into the integrated circuit and the two switches. Further, there is a risk of the static electricity or the electromagnetic wave causing erroneous operation of the related art protection circuit module and the battery pack.

Further, in the related art protection circuit module and the battery pack, a separate capacitor to prevent static electricity needs to be electrically coupled to the two switches in parallel, and a separate resistor to prevent static electricity needs to be electrically coupled to the wiring that controls the two switches.

Finally, in the related art protection circuit module and the battery pack, an integrated circuit or the two switches need to be manufactured or purchased. Accordingly, the manufacturing cost thereof increases.

Accordingly, aspects of the present invention have been made to solve the above-mentioned problems occurring in the related art, and/or other problems, and an aspect of the present invention is to provide a battery pack having a small printed circuit board area, being resistant to the failure caused by electromagnetic waves or static electricity, and having a reduced cost achieved by integrating an integrated circuit (IC), a charging switch, and a discharging switch in one semiconductor package.

In order to accomplish the above aspects of the present invention and/or other aspects, a protection circuit module includes: a printed circuit board in which at least one wiring pattern is formed; a conductive pad that is coupled to the at least one wiring pattern of the printed circuit board, and is electrically coupled to a secondary battery; and a semiconductor package that is soldered on the at least one wiring pattern of the printed circuit board, and if a voltage of the secondary battery is in overcharged or over-discharged ranges, blocks a charging path or a discharging path of the secondary battery.

According to an aspect of the present invention, the semiconductor package includes: an integrated circuit that senses the voltage of the secondary battery, and outputs a predetermined control signal according to the sensed voltage; a charging switch that selectively blocks the charging path according to the control signal of the integrated circuit; and a discharging switch that selectively blocks the discharging path according to the control signal of the integrated circuit.

Further, according to an aspect of the present invention, the semiconductor package includes: a first mounting plate; an integrated circuit that is attached to the first mounting plate, to sense the voltage of the secondary battery, and to output the predetermined control signal according to the sensed voltage; a plurality of first leads that are arranged on the outside of the first mounting plate, and are electrically coupled to the integrated circuit; a second mounting plate positioned to one side of the first mounting plate; a charging switch and a discharging switch that are attached to the second mounting plate to selectively block the charging path and the discharging path according to the control signal of the integrated circuit; a plurality of second leads that are arranged on the circumference of the second mounting plate, and are electrically coupled to the charging switch and the discharging switch; and an encapsulant that encapsulates the first mounting plate, the integrated circuit, the plurality of first leads, the second mounting plate, the charging switch, the discharging switch, and the plurality of second leads, wherein the plurality of first leads and the second leads are projected to the outside of the semiconductor package by a predetermined length.

According to an aspect of the present invention, the integrated circuit and the one of the plurality of first leads are coupled by at least one conductive wire.

According to an aspect of the present invention, the charging switch and the discharging switch, and the plurality of second leads are coupled by one or more conductive wires.

According to an aspect of the present invention, the integrated circuit and the charging switch, or the integrated circuit and the discharging switch are coupled by at least one conductive wire.

According to an aspect of the present invention, at least one of the plurality of first leads is directly coupled to the first mounting plate.

According to an aspect of the present invention, at least one of the plurality of second leads is directly coupled to the second mounting plate.

According to an aspect of the present invention, the plurality of first leads and the second leads are arranged in rows on both sides of the semiconductor package with respect to the encapsulant at the center thereof.

According to an aspect of the present invention, at least one passive element is soldered on the wiring pattern in the printed circuit board.

According to an aspect of the present invention, at least one pack terminal coupled to the outside system is formed on the wiring pattern in the printed circuit board.

According to an aspect of the present invention, a battery pack includes a rechargeable battery; a pack terminal that is coupled to the rechargeable battery in parallel; and a protection circuit module that is coupled to the rechargeable battery, to sense a voltage of the secondary battery, and selectively block the overcharge or the over-discharge thereof.

According to an aspect of the present invention, the protection circuit module includes an integrated circuit that senses the overcharge or the over-discharge of the rechargeable battery and outputs a signal that selectively blocks charging and discharging of the rechargeable battery, and a charging switch and a discharging switch that selectively block charging and discharging paths by the output signal of the integrated circuit.

According to an aspect of the present invention, the integrated circuit, the charging switch, and the discharging switch are formed as one semiconductor package.

According to an aspect of the present invention, the semiconductor package is coupled to the charging and discharging paths between the rechargeable battery and the pack terminal.

According to an aspect of the present invention, the charging switch and the discharging switch of the semiconductor package are coupled to the charging and discharging paths between the rechargeable battery and the pack terminal.

According to an aspect of the present invention, the integrated circuit of the semiconductor package is coupled to the rechargeable battery in order to sense the voltage of the rechargeable voltage.

Passive elements to block static electricity and/or voltage changes are coupled to the rechargeable battery in parallel, and the integrated circuit of the semiconductor package is coupled to the passive elements.

According to an aspect of the present invention, a single device package to control charging and discharging of a rechargeable battery includes a circuit device to detect a voltage of the rechargeable battery and to output a control signal based on the detected voltage, and which is formed on a first mounting plate; a charging switch to regulate the charging of the rechargeable battery based on the control signal, which is formed on a second mounting plate separated from the first mounting plate; a discharging switch to regulate the discharging of the rechargeable battery based on the control signal, which is formed on the second mounting plate; and a connecting wire to electrically connect the charging switch to the circuit device, which is not interposed therebetween.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Figure 1A:
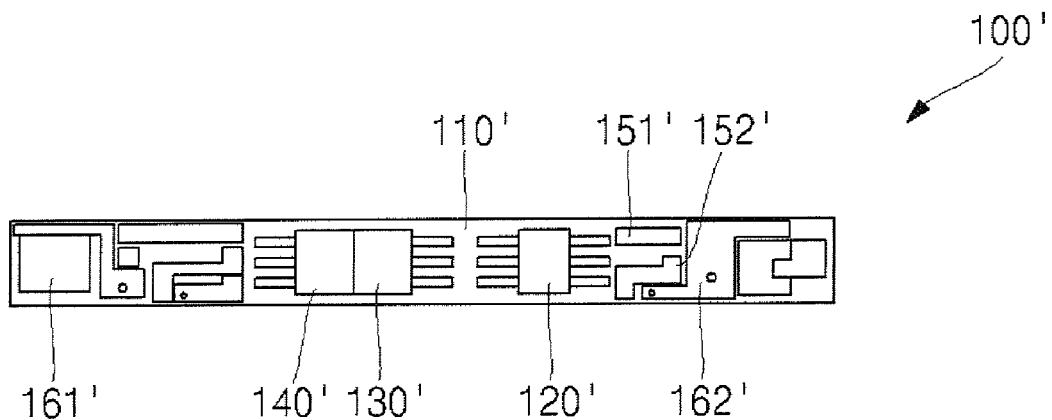
FIGS. 1A and 1B illustrate a related art protection circuit module.
Figure 1B:
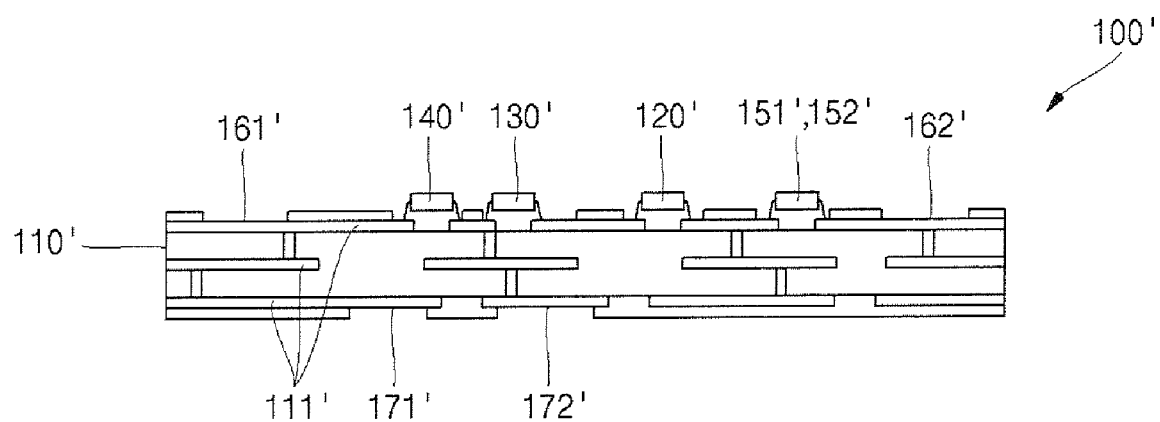
Figure 2:
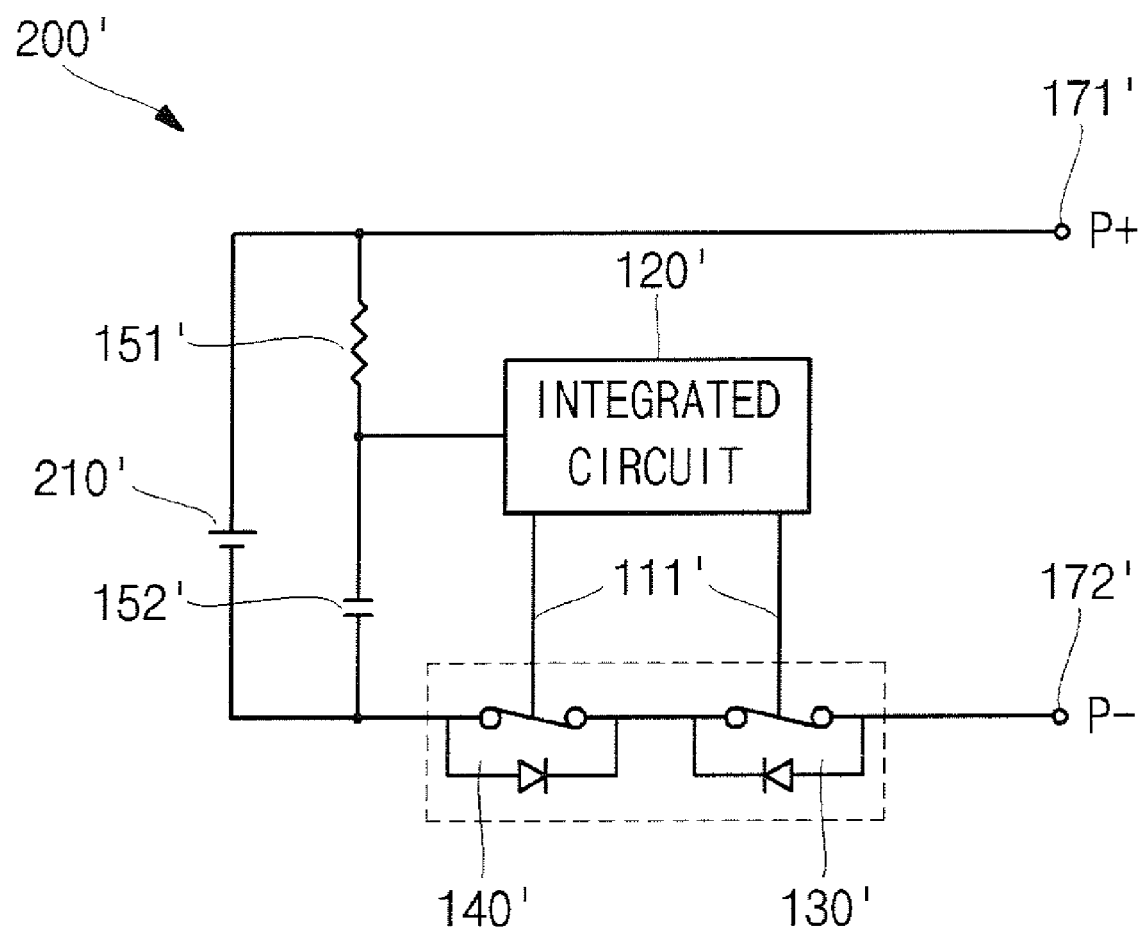
FIG. 2 is a circuit diagram illustrating a battery pack having the related art protection circuit module of FIGS. 1A and 1B.

Reference will now be made in detail to aspects of the present invention, examples of which are illustrated in the accompanying drawings, wherein like reference numerals refer to the like elements throughout. The aspects are described below in order to explain the present invention by referring to the figures.

Figure 3A:
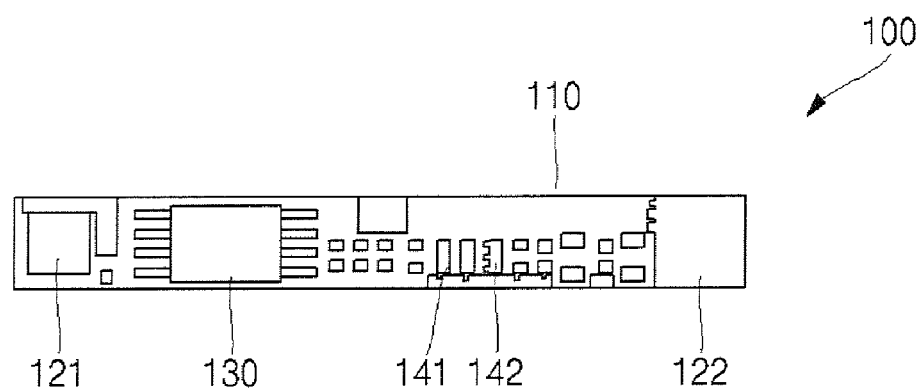
FIGS. 3A and 3B illustrate a protection circuit module according to an aspect of the present invention.
Figure 3B:
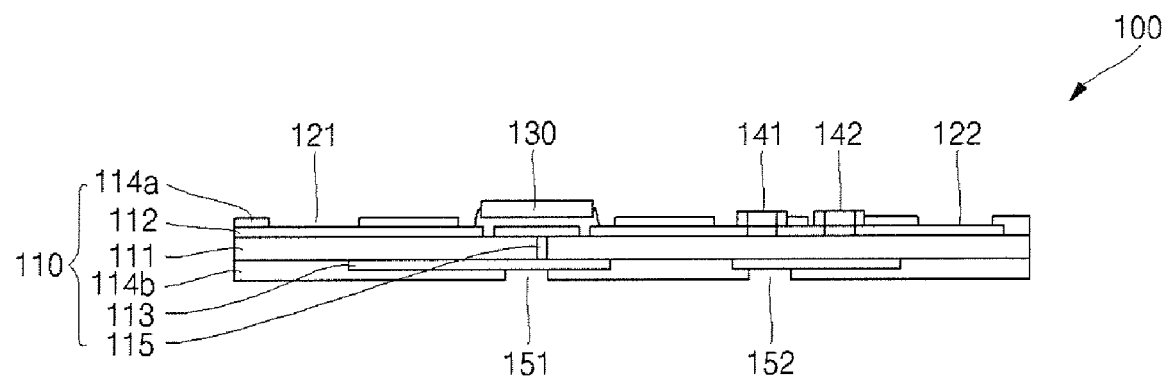

FIGS. 3A and 3B illustrate a protection circuit module 100 according to an aspect of the present invention. As illustrated, a protection circuit module 100 includes a printed circuit board 110, conductive pads 121 and 122 formed on one side of the printed circuit board 110, a semiconductor package 130 soldered on one side of the printed circuit board 110, a plurality of passive elements 141 and 142 soldered on the printed circuit board 110, and pack terminals 151 and 152 formed on the printed circuit board 110.

In the aspect shown, a plurality of wiring patterns 112 and 113 are formed on the upper side (or a first side) and the lower side (or a second side) of the printed circuit board 110 centering on (or on different sides of) the insulated layer 111. The wiring patterns 112 and 113 of the upper side and the lower side can be coupled by a conductive via 115. As shown, the insulated layer 111 is illustrated as being one layer, but the insulated layer 111 may be two or more layers depending on the density of the wiring patterns 112 and 113. Further, the wiring patterns 112 and 113 are coated by solder masks 114a and 114b for protection from the outside environment.

In the aspect shown, the conductive pads 121 and 122 are coupled to the wiring patterns 112 and 113, and are exposed to the outside through the solder mask 114a. Hence, a positive terminal and a negative terminal of the secondary battery (not shown) can be electrically and mechanically coupled to the conductive pads 121 and 122.

In the aspect shown, the semiconductor package 130 is soldered on the wiring pattern 112, though not required. The semiconductor package 130 senses or detects the voltage of the secondary battery 210 (shown schematically in FIG. 5), and blocks (or interrupts) the charging and discharging paths of the protection circuit module 100 if the voltage of the secondary battery 210 is in an overcharged range or an over-discharged range. The semiconductor package 130 further includes an integrated circuit (133 shown in FIG. 4B) that senses or detects the voltage of the secondary battery 210 and outputs a predetermined control signal according to the voltage thereof, and a charging switch (137 shown in FIG. 4B) and a discharging switch (138 shown in FIG. 4B) that selectively block (or interrupt) the charging and discharging paths thereof according to the control signal of the integrated circuit 133.

In the aspect shown, the passive elements 141 and 142 are soldered on the wiring pattern 112. The passive elements 141 and 142 can be a resistor 141 to prevent influx of static electricity and a capacitor 142 to prevent voltage changes or fluctuations, but are not limited to them. In other words, the passive elements 141 and 142 can be an inductor, a diode, a transistor, and/or other devices.

In the aspect shown, the wiring pattern 113 is coupled to the pack terminals 151 and 152, and is exposed to the outside through the solder mask 114b. Hence, an outside system (e.g., a charger or an outside load) is electrically or mechanically coupled to the pack terminals 151 and 152. In the aspect shown in FIG. 3B, the conductive pads 121, 122 are formed on the upper side (or the first side) of the printed circuit board 110, and the pack terminals 151 and 152 are formed on the lower side (or the second side) of the printed circuit board 110, but the conductive pads 121 and 122, and the pack terminals 151 and 152 can be formed on the same side thereof. Further, in the aspect shown in FIG. 3B, the semiconductor package 130 and the passive elements 141 and 142 are formed on the same side as the conductive pads 121 and 122. However, in other aspects, the semiconductor package 130 and the passive elements 141 and 142 can be formed on different sides thereof. In this aspect, the semiconductor package 130 and the passive elements 141 and 142 can be formed on the side of the printed circuit board 100 where the pack terminals 151 and 152 are formed.

Figure 4A:
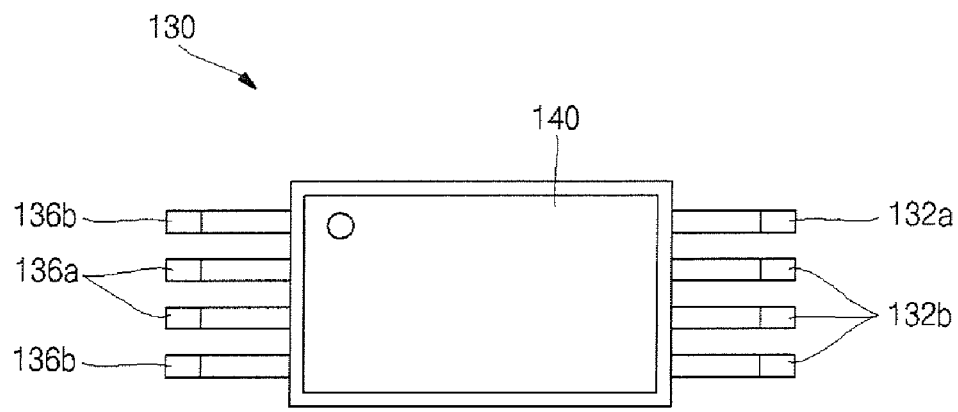
FIGS. 4A, 4B, and 4C illustrate a semiconductor package in which an integrated circuit and one or more switches are integrated, and the semiconductor package without an encapsulant according to an aspect of the present invention.
Figure 4B:
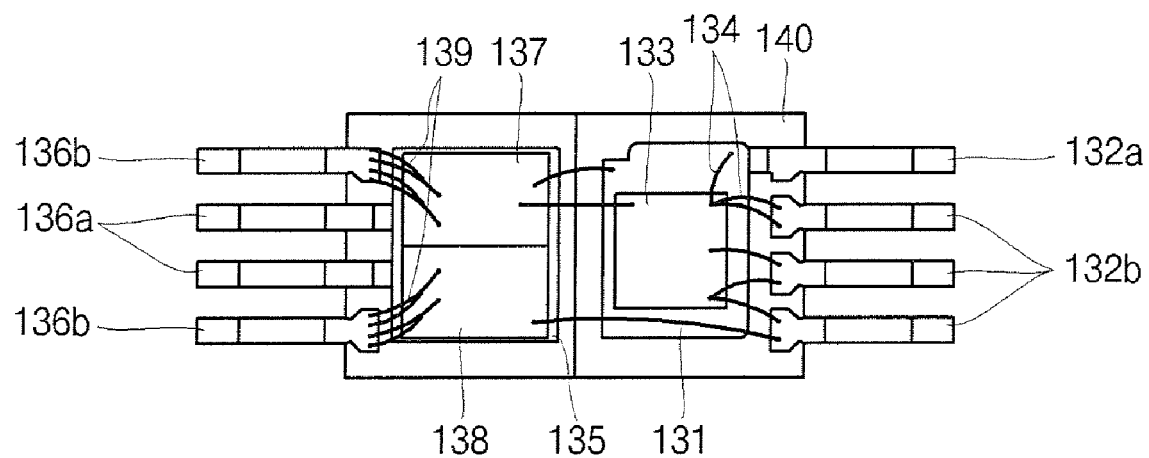
Figure 4C:
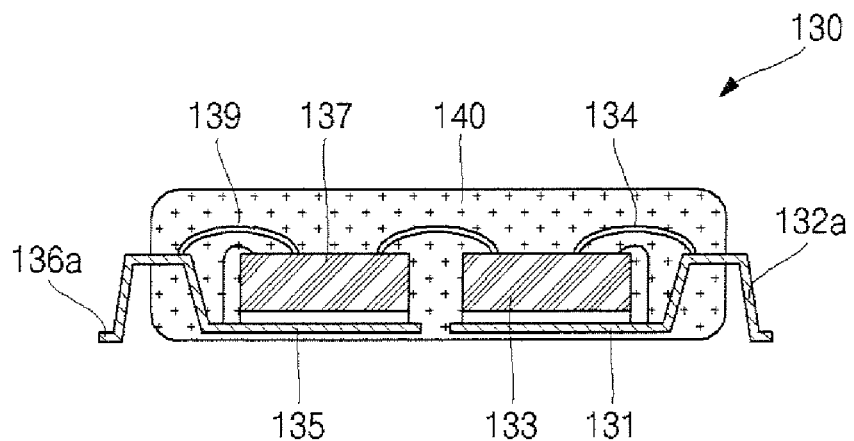

FIGS. 4A, 4B, and 4C illustrate a semiconductor package 130 in which an integrated circuit 133 and one or more switches are integrated, and illustrate the semiconductor package 130 without an encapsulant 140 according to an aspect of the present invention. As illustrated in FIGS. 4A, 4B, and 4C, a semiconductor package 130 useable with the protection circuit module according to an aspect of the present invention includes a first mounting plate 131, an integrated circuit 133, a plurality of first leads 132a and 132b, a second mounting plate 135, a charging switch 137, a discharging switch 138, a plurality of second leads 136a and 136b, and the encapsulant 140.

In the aspect shown, the first mounting plate 131 is a flat-board type mounting plate. The first mounting plate 131 is made of conductive materials, e.g., copper (Cu), copper alloy (Cu alloy), iron (Fe) and/or other materials, but are not limited to them.

In the aspect shown, the integrated circuit 133 is attached or coupled to the first mounting plate 131 by adhesives, and/or other attaching or coupling techniques, for example, but is not limited thereto. The integrated circuit 133 is electrically coupled to the secondary battery 210, and senses or detects the voltage of the secondary battery 210. Further, the integrated circuit 133 outputs charging and/or discharging stop signals if it is determined that the voltage of the secondary battery 210 is an overcharged voltage or an over-discharged voltage. A voltage-detection circuit (not shown), a comparison circuit (not shown), a time-delay circuit (not shown), a switch-operating circuit (not shown), an oscillator (not shown), and/or a power-supply circuit (not shown), for example, are integrated in the integrated circuit 133. In a non-limiting aspect, the integrated circuit 133 is formed in a one silicon-chip type device.

In the aspect shown, the plurality of first leads 132a and 132b are arranged in rows at one side of the first mounting plate 131, though not required. One first lead 132a among a plurality of the first leads 132a and 132b can be directly coupled to the first mounting plate 131. Another first lead 132b is separated from the first mounting plate 131 by a predetermined distance. Further, the integrated circuit 133 and the first leads 132a and 132b are coupled by conductive wires 134. Moreover, the integrated circuit 133 can be coupled to the first mounting plate 131 by at least one of the conductive wires 134, which may be predetermined.

In the aspect shown, the second mounting plate 135 is a flat-board type mounting plate that is formed on one side of the first mounting plate 131. The second mounting plate 135 is made of one or more conductive materials, e.g., copper (Cu), copper alloy (Cu alloy), iron (Fe), and/or other materials, but is not limited to them. In the aspect shown, it is desirable, but not required that the first mounting plate 131 and the second mounting plate 135 are separately installed from each other by a certain distance. The first mounting plate 131 and the second mounting plate 135 are separated because a charging switch 137 and a discharging switch 138 that are mounted on the second mounting plate 135 generate much heat. Accordingly, if the generated heat is transferred to the integrated circuit 133 of the first mounting plate 131, the electrical performance of the integrated circuit 133 can be lowered or deteriorated. In various aspects, additional heat shields may be included in between the first mounting plate 131 and the second mounting plate 135 to act as a heat barrier to enhance the shielding and/or insulating of heat.

In the aspect shown, the charging switch 137 and the discharging switch 138 are attached or coupled to the second mounting plate 135. For example, the charging switch 137 and the discharging switch 138 can be attached or coupled to the second mounting plate 135 by conductive adhesives, or other attaching or coupling techniques. In the various aspects shown, conductive adhesives can be solder (Sn/Pb), nickel (Ni), vanadium (V), gold (Au), silver (Ag), an anisotropic conductive film (ACF), and/or other materials, but are not limited to them. In the aspect shown, the charging switch 137 and the discharging switch 138 can be a Power MOSFET, and/or other switches, but are not limited to them. In other aspects, the second mounting plate 135 may be divided into at least two pieces so that the charging switch 137 and the discharging switch 138 are respectively attached or coupled to the respective piece thereof.

In the aspect shown, the plurality of second leads 136a and 136b are arranged in rows to one side of the second mounting plate 135, though not required. One second lead 136a among a plurality of second leads 136a and 136b can be directly coupled to the second mounting plate 135. Another second lead 136b is separated by a certain distance from the second mounting plate 135. Further, the charging switch 137 and the second leads 136a and 136b, and the discharging switch 138 and the second leads 136a and 136b are coupled by conductive wires 139. Moreover, the charging switch 137 or the discharging switch 138 can be electrically coupled to the integrated circuit 133, the first mounting plate 131, the first lead 132a and/or 132b by conductive wires 134 and/or 139, though not required. In the aspect shown in FIG. 4B, the charging switch 137 is connected to the integrated circuit 133 and the first mounting plate 131, and the discharging switch 138 is connected to one of the leads 132b. In other aspects, other connecting arrangements are within the scope of the invention.

In the aspect shown, the encapsulant 140 encapsulates the first mounting plate 131, the integrated circuit 133, the first leads 132a and 132b, the second mounting plate 135, the charging switch 137, the discharging switch 138, the second leads 136a and 136b, and the conductive wires 134 and 139 to protect the various elements from mechanical, physical, and chemical environments and their effects. However, as shown, the first leads 132a and 132b, and the second leads 136a and 136b project and extend to the outside of the encapsulant 140 by a predetermined length. As shown, the encapsulant 140 can be an epoxy-molding compound, silicon, and/or other materials, but is not limited to them.

Further, in the aspect shown, the first leads 132a and 132b, and the second leads 136a and 136b can be formed in rows to the sides of the semiconductor package 130 centered about the encapsulant 140. In other words, the semiconductor package 130 can be a dual-inline-package type device. However, in other aspects, the first lead 132a and 132b and the second lead 136a and 136b can be formed in rows on the four sides of the semiconductor package 130 centered about the encapsulant 140. In other words, the semiconductor package 130 can be a quad-flat-package type device, but is not limited to them, and the semiconductor package 130 can be various other device types or have other arrangements thereof.

In the aspect shown, the protection circuit module 100 is formed by an integrated circuit 133 that senses or detects the voltage of a secondary battery 210, and outputs the control signal to block the overcharging and the over-discharging thereof. The semiconductor package 130 includes a charging switch 137 and a discharging switch 138 that block (or interrupt) the charging and/or discharging paths by the output signal of the integrated circuit 133.

By way of the above, the area of the printed circuit board 110 is reduced. As shown, since the area of the printed circuit board 110 is reduced, the volume of the secondary battery can be relatively increased, to lead to an increase in the total capacity of the battery pack.

Further, in the aspect shown, the protection circuit module 100 implements the integrated circuit 133, the charging switch 137, and the discharging switch 138 on one semiconductor package 130. Accordingly, the number of parts to be soldered is reduced, reducing the number of work operations needed and the defect rates of the soldering processes.

Further, in the aspect shown, since the protection circuit module 100 does not have to form separate wiring patterns to couple the integrated circuit 133, the charging switch 137, and the discharging switch 138 on to the printed circuit board 110, the number of layers of the printed circuit board 110 can be minimized, and the design of the wiring patterns formed at the printed circuit board 110 can be simplified according to the decrease in the number of layers. Accordingly, the volume of the secondary battery 210 is increased, and the capacity of the battery pack 200 (such as shown in FIG. 5) is increased.

Further, in the aspect shown, since the protection circuit module 100 does not need to form separate wiring patterns to couple an integrated circuit 133, the charging switch 137, and the discharging switch 138 to the printed circuit board 110, and the plurality of conductive wires 134, 139 that couple the switches 137,138 are encapsulated by a relatively thick encapsulant 140, the possible influx of external electromagnetic wave or static electricity can be reduced. In other words, the protection circuit module 100 has little possibility of erroneous operation caused by the static electricity or the electromagnetic wave, and little possibility of a breakdown.

Further, in the aspect shown, the integrated circuit 133, the charging switch 137, and the discharging switch 138 are implemented as or formed into one semiconductor package 130. Accordingly, the manufacturing costs thereof are significantly reduced and the manufacturing costs of the protection circuit module 100 and the battery pack can be reduced accordingly.

Figure 5:
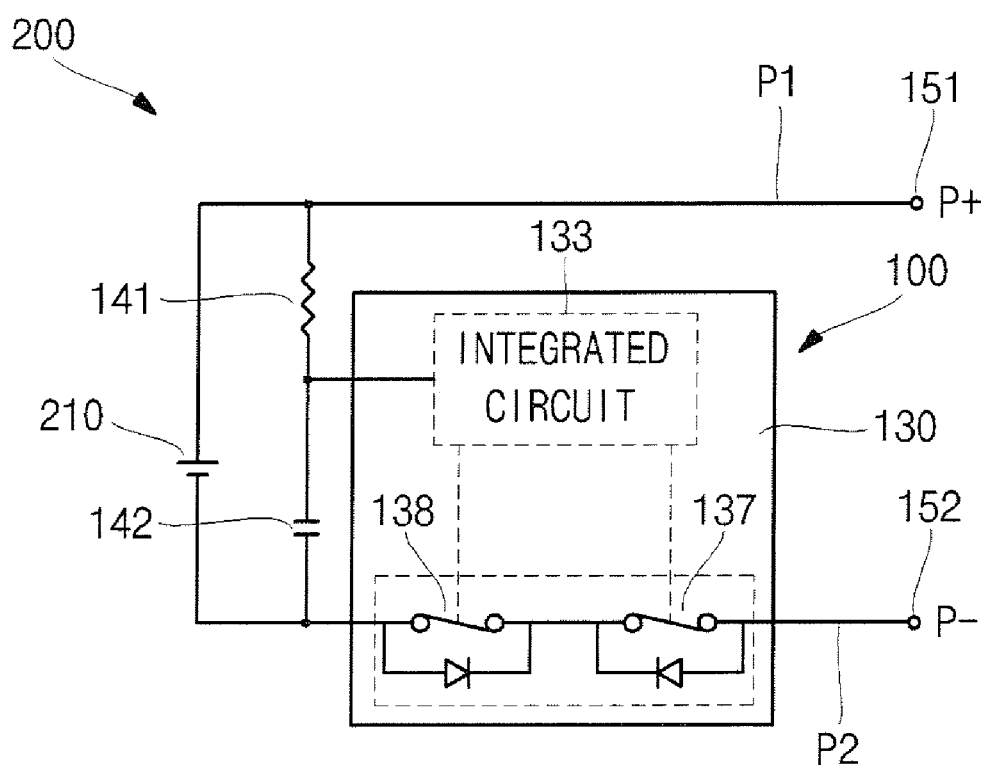
FIG. 5 is a circuit diagram illustrating a battery pack using a protection circuit module according to an aspect of the present invention.

FIG. 5 is a circuit diagram illustrating a battery pack 200 using a protection circuit module 100 according to an aspect of the present invention. As illustrated, the battery pack 200 includes a secondary battery 210, pack terminals 151 and 152, a protection circuit module 100, and passive elements 141 and 142. Here, the pack terminals 151 and 152 and the passive elements 141 and 142 are integrated in the protection circuit module 100. Each will be described separately.

In the aspect shown, the secondary battery 210 can be a chargeable and dischargeable battery having a positive pole and a negative pole. For example, the secondary battery 210 is a lithium ion battery or a lithium polymer secondary battery, but is not limited to them.

In the aspect shown, the pack terminal 151 and 152 can be coupled to the positive pole and the negative pole of the secondary battery 210 via the charging and discharging wirings P1, P2. A charger or an outside load can be coupled to the pack terminals 151 and 152. In this aspect, the pack terminals 151 and 152 are integrated into the protection circuit module 100.

In the aspect shown, the protection circuit module 100 is coupled between the secondary battery 210 and one of the charging and the discharging wirings P2. If the secondary battery 210 is in the overcharged or over-discharged state, or if the voltage of the secondary battery 210 is in the overcharged or over-discharged ranges, the protection circuit module 100 blocks (or interrupts) the charging and discharging wiring (P2), i.e., the charging and discharging path.

As shown, a voltage-detection circuit (not shown), a comparison circuit (not shown), a time-delay circuit (not shown), a switch-operating circuit (not shown), an oscillator (not shown), and/or a power-supply circuit (not shown) are integrated into the integrated circuit 133. Further, the charging switch 137 and the discharging switch 138 can be a Power MOSFET, and a parasitic diode is formed on the switches 137, 138, respectively.

Further, in the aspect shown, the integrated circuit 133, the charging switch 137, and the discharging switch 138 are implemented as or formed into one semiconductor package 130. Accordingly, a wiring pattern formed on a printed circuit board 100, for example, is not interposed between the integrated circuit 133 and the charging switch 137, and the integrated circuit 133 and the discharging switch 138. Further, the wiring pattern formed on the printed circuit board 100, for example, is not interposed between the charging switch 137 and the discharging switch 138.

Further, in the aspect shown, each of the passive elements 141 and 142 can be a resistor and/or a capacitor. For example, the resistor 141 is coupled to the charging and discharging wiring (P1) between the positive pole of the secondary battery 210 and the pack terminal 151. One side of the capacitor 142 is coupled to the resistor 141, and another side of the capacitor 142 is coupled to the negative pole of the secondary battery 210 and the other charging and discharging wiring (P2) of the pack terminal 152. Further, the protection circuit module 100 (i.e., the integrated circuit 133) is coupled to the node (N1) between the resistor 141 and the capacitor 142 so that the voltage of the second battery 210 is sensed or detected. In the aspect shown, the resistor 141 prevents or reduces the influx of static electricity, and the capacitor 142 prevents or reduces power changes or fluctuations.

The battery pack according an aspect of the present invention operates or is operated as follows.

According to an aspect of the present invention, if the pack terminals 151 and 152 of the battery pack 200 are coupled to a charger, and the secondary battery 210 is charged, the protection circuit module 100 (i.e., the integrated circuit 133) senses or detects the charging voltage of the secondary battery 210. If the charging voltage of the secondary battery 210 is within a normal range (e.g., 2.3V to 4.3V), the integrated circuit 133 outputs a control signal that turns on the charging switch 137 and the discharging switch 138. In this aspect, the normal charging is done through a charger (not shown), the pack terminal 151, the secondary battery 210, the discharging switch 138, the charging switch 137, and the pack terminal 152.

Then, as a result of sensing or detecting of the charging voltage of the secondary battery 210 by the integrated circuit 133, if the charging voltage is in the over-charged range (e.g., greater than 4.3V), the integrated circuit 133 outputs a charging stop signal to the charging switch 137. In other words, the integrated circuit 133 turns off the charging switch 137. In this aspect, since a parasitic diode formed on the charging switch 137 is formed in the reverse direction from the direction taken by the charging current, the charging of the secondary battery 210 is stopped.

However, if the battery pack 200 is coupled to the outside load (not shown), and discharged, since the parasitic diode of the charging switch 137 is formed in the forward direction taken by the discharging current, the discharging of the secondary battery 210 becomes possible.

In this aspect, if an outside load (not shown) is coupled to the pack terminals 151 and 152 of the battery pack 200, the protection circuit module 100 (i.e., the integrated circuit 133) senses or detects the discharging voltage of the secondary battery 210. If the discharging voltage of the secondary battery 210 is within the normal range (e.g., 2.3V to 4.3V), the integrated circuit 133 outputs a control signal that turns on the charging switch 137 and the discharging switch 138. In this aspect, the normal discharging is done through the secondary battery 210, the pack terminal 151, the outside load, the pack terminal 152, the charging switch 137, and the discharging switch 138.

As a result of sensing or detecting the discharging voltage of the secondary battery 210, when the voltage is in the over-discharged range (e.g., less than 2.3V), the integrated circuit 133 outputs the stop signal to the discharging switch 138. The integrated circuit 133 turns off the discharging switch 138. In this aspect, because the parasitic diode is formed on the discharging switch 138 in the reverse direction from that taken by the discharging current, the discharging of the secondary battery 210 is stopped.

However, if the battery pack 200 is coupled to an outside charger, and is charged, because the parasitic diode of the discharging switch 138 is formed in the forward direction taken by the charging current, the charging of the secondary battery 210 becomes possible.

Further, in the aspect shown, while the battery pack 200 is operated, because the control signal from the integrated circuit 133 is transferred to the charging switch 137 and the discharging switch 138 by the conductive wires, not the wiring pattern of the printed circuit board 110, and because the charging switch 137 and the discharging switch 138 are electrically coupled, the effects by external static electricity or electromagnetic wave are minimized.

In various aspects, the components in the semiconductor package such as the integrated circuit, the charging switch, and the discharging switch may be stacked or arranged to make the semiconductor package more compact.

Although discussed in terms of a secondary battery or a lithium secondary battery, any rechargeable battery is within the scope of the aspects of the present invention.

According to an aspect of the present invention, the integrated circuit senses or detects the voltage of the secondary voltage, and outputs the control signal that blocks (or interrupts) the overcharging and the over-discharging voltages of a rechargeable battery, and a charging switch and a discharging switch block (or interrupt) the charging and discharging paths by way of the output control signal. Further, since a protection circuit module and a battery pack using the same are formed having the integrated circuit, the charging switch, and the discharging switch in a single semiconductor package, the length and the width of the printed circuit board are reduced. Since the area of the printed circuit board is reduced, the volume of the secondary battery is relatively increased, and the total capacity of the battery pack can also be increased accordingly.

According to an aspect of the present invention, the integrated circuit and the two switches are implemented as or formed into one semiconductor package. Accordingly, the number of parts to be soldered is reduced, whereby the number of work steps is reduced, and the defect rates of the soldering decreases.

According to an aspect of the present invention, since the separate wiring pattern does not need to be formed in order to couple the integrated circuit and the two switches on the printed circuit board, the number of layers of the printed circuit board can be reduced. Hence, the volume of the secondary battery can be relatively increased, and the capacity of the battery pack can be increased accordingly.

According to an aspect of the present invention, since the separate wiring pattern does not need to be formed in order to couple the integrated circuit and the two switches on a printed circuit board, the possibility of the influx of the outside electromagnetic wave or static electricity can be reduced. Hence, the possibility of erroneous operation of the protection circuit module is reduced, and the possibility of a breakdown is reduced.

According to an aspect of the present invention, a separate capacitor or a resistor does not have to be formed on a switch in parallel or in series in order to prevent a breakdown by the outside static electricity. In other words, aspects of the present invention can reduce the number of parts on the printed circuit board.

According to an aspect of the present invention, since an integrated circuit and the two switches are formed into one semiconductor package, manufacturing costs are reduced, and the manufacturing costs of the protection circuit module and the battery pack can be reduced accordingly.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A protection circuit module of a secondary battery, comprising:
    a printed circuit board in which at least one wiring pattern is formed;
    a conductive pad that is coupled to the at least one wiring pattern, and is electrically coupled to the secondary battery; and
    a semiconductor package that is soldered on the at least one wiring pattern and blocks a charging path or a discharging path of the secondary battery if a voltage of the secondary battery is in overcharged or over-discharged ranges.

2. The protection circuit module as claimed in claim 1, wherein the semiconductor package includes:
    an integrated circuit that senses the voltage of the secondary battery and outputs a predetermined control signal according to the sensed voltage;
    a charging switch that selectively blocks the charging path according to the predetermined control signal; and
    a discharging switch that selectively blocks the discharging path according to the predetermined control signal.

3. The protection circuit module as claimed in claim 1, wherein the semiconductor package includes:
    a first mounting plate;
    an integrated circuit that is attached to the first mounting plate, to sense the voltage of the secondary battery, and to output a predetermined control signal according to the sensed voltage;
    a plurality of first leads that are arranged on the outside of the first mounting plate, and are electrically coupled to the integrated circuit;
    a second mounting plate positioned to one side of the first mounting plate;
    a charging switch and a discharging switch that are attached to the second mounting plate, and which selectively block the charging path and the discharging path according to the predetermined control signal;
    a plurality of second leads that are arranged on the circumference of the second mounting plate, and are electrically coupled to the charging switch and the discharging switch; and
    an encapsulant that encapsulates the first mounting plate, the integrated circuit, the plurality of first leads, the second mounting plate, the charging switch, the discharging switch, and the plurality of second leads, wherein the plurality of the first leads and the second leads are projected to the outside of the semiconductor package by a predetermined length.

4. The protection circuit module as claimed in claim 3, wherein the integrated circuit and one of the plurality of first leads are coupled by at least one conductive wire.

5. The protection circuit module as claimed in claim 3, wherein the charging switch and the discharging switch, and the plurality of second leads are coupled by one or more conductive wires.

6. The protection circuit module as claimed in claim 3, wherein the integrated circuit and the charging switch, or the integrated circuit and the discharging switch are coupled by at least one conductive wire.

7. The protection circuit module as claimed in claim 3, wherein at least one of the plurality of first leads is directly coupled to the first mounting plate.

8. The protection circuit module as claimed in claim 3, wherein at least one of the plurality of second leads is directly coupled to the second mounting plate.

9. The protection circuit module as claimed in claim 3, wherein the plurality of the first leads and the second leads are arranged in rows on the sides of the semiconductor package with respect to the encapsulant at the center thereof.

10. The protection circuit module as claimed in claim 1, further comprising at least one passive element soldered on the at least one wiring pattern.

11. The protection circuit module as claimed in claim 1, further comprising at least one pack terminal coupled to an outside system formed on the at least one wiring pattern.

12. A battery pack comprising:
    a rechargeable battery;
    a pack terminal that is coupled to the rechargeable battery in parallel; and
    a protection circuit module, that is coupled to the rechargeable battery, to sense a voltage of the rechargeable battery, and to block an overcharging or an over-discharging of the rechargeable battery,
    wherein the protection circuit module includes:
        an integrated circuit that senses the overcharging or the over-discharging of the rechargeable battery and outputs a signal that blocks the charging and the discharging thereof; and a charging switch and a discharging switch that selectively block the charging and discharging paths by the output signal, and wherein the integrated circuit, the charging switch, and the discharging switch are formed as one semiconductor package.

13. The battery pack as claimed in claim 12, wherein the semiconductor package is coupled to the charging and discharging paths between the rechargeable battery and the pack terminal.

14. The battery pack as claimed in claim 12, wherein the charging switch and the discharging switch of the semiconductor package are coupled to the charging and discharging paths between the rechargeable battery and the pack terminal.

15. The battery pack as claimed in claim 12, wherein the integrated circuit of the semiconductor package is coupled to the rechargeable battery to sense the voltage of the rechargeable voltage.

16. The battery pack as claimed in claim 12, wherein passive elements to block static electricity and/or voltage changes are coupled to the rechargeable battery in parallel, and the integrated circuit of the semiconductor package is coupled to the passive elements.

17. A single device package to control charging and discharging of a rechargeable battery, comprising:
- a circuit device to detect a voltage of the rechargeable battery and to output a control signal based on the detected voltage, and which is formed on a first mounting plate;
- a charging switch to regulate the charging of the rechargeable battery based on the control signal, which is formed on a second mounting plate separated from the first mounting plate;
- a discharging switch to regulate the discharging of the rechargeable battery based on the control signal, which is formed on the second mounting plate; and
- a connecting wire to electrically connect the charging switch to the circuit device, which is not interposed therebetween.

18. The single device package as claimed in claim 17, further comprising:
- one or more first leads, wherein one of the first leads is directly coupled to the first mounting plate and have a first connecting wire to connect to the circuit device, and the remaining first leads are connected to the circuit device by a second connecting wire; and
- one or more second leads, wherein two of the second leads are directly coupled to the second mounting plate and one of the remaining second leads is connected to the charging switch by a third connecting wire, and another of the remaining second leads is connected to the discharging switch by a fourth connecting wire.

19. The single device package as claimed in claim 17, wherein the first and second switches each include a parasitic diode.

20. The single device package as claimed in claim 19, wherein the parasitic diode of the discharging switch is formed in a reverse direction from that taken by a discharging current so that the discharging of the rechargeable battery is stopped.

21. The single device package as claimed in claim 19, wherein the parasitic diode of the charging switch is formed in the reverse direction from that taken by a charging current so that the charging of the rechargeable battery is stopped.

22. The single device package as claimed in claim 17, wherein the circuit device, the charging switch, the discharging switch, and the connecting wire are encapsulated in an encapsulant.

23. The single device package as claimed in claim 18, further comprising an encapsulant that encapsulates the circuit device, the charging switch, the discharging switch, and the connecting wire, wherein the one or more first leads and the one or more second leads extend beyond the encapsulant.

24. The single device package as claimed in claim 17, wherein the integrated circuit, the charging switch, and the discharging switch are integrated into the single device package so that a number of soldering operation is reduced.

25. The single device package as claimed in claim 17, wherein the charging switch and the discharging switch are electrically coupled, and a control signal output from the integrated circuit is transferred to the charging switch and the discharging switch by the conductive wire so that effects by external static electricity or electromagnetic wave are minimized.

26. A protection circuit module including the single device package as claimed in claim 17, further comprising:
- a printed circuit board;
- conductive pads formed on one side of the printed circuit board;
- a plurality of passive elements soldered on the printed circuit board; and
- pack terminals formed on the printed circuit board.

27. A battery pack including the protection circuit module as claimed in claim 26, further comprising a rechargeable lithium secondary battery.

* * * * *